US005524094A

United States Patent [19]

Nobukata et al.

[11] Patent Number: 5,524,094

[45] Date of Patent: Jun. 4, 1996

[54] NONVOLATILE MEMORY DEVICE WITH NAND ARRAY

[75] Inventors: Hiromi Nobukata; Kenichi Satori, both of Kanagawa, Japan

[73] Assignee: Sony Corporation, Tokyo, Japan

[21] Appl. No.: 293,915

[22] Filed: Aug. 22, 1994

[30] Foreign Application Priority Data

Aug. 31, 1993 [JP] Japan .................................. 5-216623
Dec. 22, 1993 [JP] Japan .................................. 5-323896

[51] Int. Cl.$^6$ .................................................. G11C 7/00
[52] U.S. Cl. ................... 365/185.21; 365/185.17; 365/185.25; 365/185.22
[58] Field of Search ........................ 365/210, 185, 365/203, 205, 207, 208, 202, 185.17, 185.20, 185.21

[56] References Cited

U.S. PATENT DOCUMENTS 5,228,106  7/1993  Ang ......................................... 365/208
5,243,573  9/1993  Makihara ................................ 365/205
5,297,092  3/1994  Johnson ................................. 365/203
5,301,160  4/1994  McAdams ......................... 365/203 X Primary Examiner—David C. Nelms
Assistant Examiner—Son Mai
Attorney, Agent, or Firm—Ronald P. Kananen

[57] ABSTRACT

A semiconductor nonvolatile memory device which enables shortening of the time of the bit verification operation and thus high speed reading operations, including a first memory cell array connected to a first bit line, a second memory cell array connected to a second bit line, a first transistor operatively connecting the first bit line and a first node, a second transistor operatively connecting the second bit line and a second node, a precharging circuit for precharging the first and second bit lines, and an equalizing circuit for equalizing the sense amplifier, wherein, at the time of a verification read operation, the gate electrode of the transistor connected to the bit line on the reference side is given as input a control signal set to a level not more than a voltage comprised of the precharge voltage of that bit line plus the threshold voltage of that transistor.

2 Claims, 13 Drawing Sheets

NONVOLATILE MEMORY DEVICE WITH NAND ARRAY

BACKGROUND OF THE INVENTION

1. Field of the Invention

The present invention relates to a nonvolatile memory device, for example, an electrically erasable nonvolatile memory device such as a flash EEPROM.

2. Description of the Related Art

A NAND type flash EEPROM, for example, comprises an N-type substrate on which are placed P-wells over which in turn are formed memory cells.

In a NAND type flash EEPROM having such a construction, in an erasing operation, when a high voltage (about 20 V) is applied to a P-well and an N-type substrate, and a control gate are maintained at 0 V, a tunnel-effect current then flows and the electrons are injected to the P-well. As a result, a threshold voltage $V_{th}$ of the memory cell shifts from positive to negative.

Specifically, in a write operation, the N-type substrate, P-well, and diffusion layer are maintained at 0 V and a high voltage (about 20 V) is applied to the control gate, whereupon a tunnel-effect current flows and electrons are injected into the floating gate. As a result, the threshold voltage $V_{th}$ of a memory cell shifts from negative to positive.

Explaining this more specifically using a cell array, when writing the data "0", a bit line of the memory is set to 0 V, while when writing the data "1", the bit line is set to 7 V. A voltage of 20 V is applied to the control gate of the selected memory transistor, while 10 V is applied to other control gates of the other non-selected memory transistors.

When the bit line is set to 0 V, a potential difference of 20 V is given between a channel and the control gate, tunnel-effect electrons are injected into the floating gate, and the threshold voltage $V_{th}$ of the memory cell shifts from negative to positive. On the other hand, when a bit line is set to 7 V, the potential difference between the channel and the control gate becomes 13 V and so the threshold voltage $V_{th}$ is held at the negative level as at the time of the erasing operation.

In a read operation, 5 V is applied to the bit line and 0 V to the source line, and 0 V is given to the control gate of the selected memory cell and 5 V to other control gates of the non-selected memory cells.

The non-selected memory cells must be kept in the ON state regardless of the data. Therefore, the threshold voltage $V_{th}$ of these memory cells is controlled to a predetermined value, for example, not more than 3.5 V.

By applying 0 V to the control gate of the selected memory cell, the threshold voltage $V_{th}$ is negative when the data is "1", so the cell becomes the ON state (depletion state) and a cell current flows.

On the other hand, when the data is "0", the threshold voltage $V_{th}$ is positive, so the cell becomes the OFF state (enhancement state) and no cell current flows. As a result, whether the data is the "1" or "0" determines if a cell current flows from the bit line to the source line through a plurality of cells.

In a NAND type EEPROM, as explained above, when the write data is "0", the threshold voltage $V_{th}$ must be positive. More specifically, the condition $0.5 \text{ V} < V_{th}$ must be satisfied, so in a write operation, a check is made to see if a sufficient write operation was performed and the threshold voltage $V_{th}$ shifted to the level corresponding to the write data.

One method used for such a check has been, for example, a bit verification method for checking each bit.

FIG. 1 is a circuit diagram of a NAND type flash memory using the bit verification method.

In FIG. 1, S/A denotes a sense amplifier, EQL an equalizing circuit, VRFa and VRFb verification circuits, (a) and (b) cell arrays, CDC a column decoder, BLa and BLb bit lines, SEL0a, SEL1a, SEL0b, SEL1b selection gate lines, and WL0a to WL3a, WL0b to WL3b word lines.

The sense amplifier S/A is of the latch type of an open bit line form and is comprised of PMOS transistors PT1, PT2, and PT12 and NMOS transistors NT1, NT2, NT12.

The drains and gates of the PMOS transistor PT1 and the NMOS transistor NT1 and the drains and gates of the PMOS transistor PT2 and NMOS transistor NT2 are connected with each other, a connection point between the PMOS transistor PT1 and NMOS transistor NT1 (first node) and a connection point between the PMOS transistor PT2 and NMOS transistor NT2 are connected, a connection point between the PMOS transistor PT1 and the NMOS transistor NT1 and a connection point between the drains of the PMOS transistor PT2 and the NMOS transistor NT2 (second node) are connected, thereby forming a CMOS flip-flop.

Further, the sources of the PMOS transistors PT1 and PT2 and the sources of the NMOS transistors NT1 and NT2 are connected, a connection point between the sources of the PMOS transistors PT1 and PT2 is connected through the PMOS transistor PT12 to the supply source of the voltage $V_{SAH}$, and a connection point between the sources of the NMOS transistors NT1 and NT2 is connected through the NMOS transistor NT12 to a power source of the voltage $V_{SAL}$.

A connection point between the drains of the PMOS transistor PT1 and the NMOS transistor NT1, that is, a first node, is connected through a verification circuit VRFa to the bit line BLa. A point of connection between the drains of the PMOS transistor PT2 and the NMOS transistor NT2, that is, the second node, is connected through the verification circuit VRFb to the bit line BLb.

Further, a connection point between the drains of the PMOS transistor PT1 and the NMOS transistor NT1 and a connection point between the drains of the PMOS transistor PT2 and the NMOS transistor NT2 are connected through the NMOS transistors NT5 and NT6 to a not shown main data line.

Note that the gate voltages of the NMOS transistors NT5 and NT6 are controlled by the column decoder CDC.

The equalizing circuit EQL is comprised of serially connected NMOS transistors NT3 and NT4 and is connected in parallel with respect to the sense amplifier S/A, that is, between a connection point between the drains of the PMOS transistor PT1 and NMOS transistor NT1 and a connection point between the drains of the PMOS transistor PT2 and the NMOS transistor NT2. The gates of the NMOS transistors NT3 and NT4 are connected to a supply line of the equalizing signal Ve, while a connection point between the NMOS transistors NT3 and NT4 is connected to the power feeding line of a power supply of (½) $V_{cc}$.

The verification circuit VRFa is comprised of the NMOS transistors NT7a to NT9a and converts data at the time of the verification operation.

The NMOS transistor NT7a is connected between a connection point between the drains of the PMOS transistor PT1 and NMOS transistor NT1 of the sense amplifier S/A and the bit line BLa, while the NMOS transistors NT8a and NT9a are connected in series between the bit line BLa and the power supply $V_{cc}$.

The gate of the NMOS transistor NT7a is connected to a supply line of the signal Vta, while the gate of the NMOS transistor NT8a is connected to a connection point between the drains of the PMOS transistor PT1 and NMOS transistor NT1 of the sense amplifier S/A, that is, the first node. The gate of the NMOS transistor NT9a is connected to a signal line of the signal Vav.

The verification circuit VRFb is comprised of the NMOS transistors NT7b to NT9b and converts data at the time of a verification operation.

The NMOS transistor NT7b is connected between a connection point between the drains of the PMOS transistor PT2 and NMOS transistor NT2 of the sense amplifier S/A and the bit line BLb, while the NMOS transistors NT8b and NT9b are connected in series between the bit line BLb and the power supply $V_{cc}$.

The gate of the NMOS transistor NT7b is connected to the supply line of the signal Vtb, while the gate of the NMOS transistor NT8b is connected to a connection point between the drains of the PMOS transistor PT2 and NMOS transistor NT2 of the sense amplifier S/A, that is, the second node. The gate of the NMOS transistor NT9b is connected to a signal line of the signal Vbv.

The cell array (a) is comprised of selection gates SG0a and SG1a comprised in turn of the memory transistors MT0a to MT3a.

The memory transistors MT0a to MT3a are connected in series. Their gates are connected to the word lines WL0a to WL3a.

The drain of the memory transistor MT0a is connected through the selection gate SG0a to the bit line BLa, while the source of the memory transistor MT3a is connected through the selection gate SG1a to the ground.

The gate of the selection gate SG0a is connected to the selection gate line SEL0a, while the gate of the selection gate SG1a is connected to the selection gate line SEL1a.

Further, the bit line BLa is connected through a precharge transistor PRa comprised of an NMOS transistor to the signal line of the voltage Va, while the gate of the transistor PRa is connected to the signal line of the precharge signal Vpa.

The cell array (b) is comprised of the selection gates SG0b and SG1b comprised in turn of the memory transistors MT0b to MT3b, a dummy memory cell DMC, and an NMOS transistor.

The memory transistors MT0b to MT3b and the dummy memory cell DMC are connected in series. Their gates are connected to the word lines WL0b to WL3b and DWL, respectively.

The drain of the memory transistor MT0b is connected through the selection gate SG0b to the bit line BLb, while the source of the dummy memory cell DMC is connected through the selection gate SG1b to the ground.

The gate of the selection gate SG0b is connected to the selection gate line SEL0b, while the gate of the selection gate SG1b is connected to the selection gate line SEL1b.

Further, the bit line BLb is connected through a precharge transistor PRb comprised of an NMOS transistor to the signal line of the voltage Vb, while the gate of the transistor PRb is connected to the signal line of the precharge signal Vpb.

Here, an explanation will be given of the verification operation in the above configuration based on the timing chart of FIG. 2 using the cell array (a) as the reading side and the cell array (b) as the reference side.

First, before the verification operation, the immediately previous write data is latched in the sense amplifier S/A. Further, the dummy cell DMC on the reference side at the time of a read operation is in a state erased by ultraviolet light with no cell current flowing through it.

In such a state, first, the precharge signals Vpa and Vpb are set to the high level in the interval between the period t1 and t2 and are supplied to the gates of the precharge transistors PRa and PRb. As a result, the read side bit line BLa is precharged to the voltage of Va and the reference side bit line BLb is precharged to the voltage of Vb. In actuality, for example, the read side bit line BLa is precharged to a voltage higher than that of the reference side bit line BLb. That is, the voltages Va and Vb are set so that $V_{cc}$>Va>Vb.

Next, the voltages of the word lines WL and the selection gate lines SEL are set to the high level in the interval of the periods t2 to t3.

At this time, if cell current is flowing, the data of the selected cell is "1" and the voltage of the read side bit line BLa falls below the voltage of the reference side bit line BLb.

As opposed to this, if no cell current is flowing, the data of the selected cell is "0" and the voltage of the read side bit line BLa is higher than the voltage of the reference side bit line BLb.

Next, after the voltage of the word line WL drops, an activation signal Vav is set to the high level in the interval between the times t3 to t4 and is supplied to the gate of the NMOS transistor NT9a of the verification circuit VRFa.

At this point of time, since the write data is latched in the sense amplifier S/A, for example, if after the data "1" has been written, the NMOS transistor NT8a of the verification circuit VRFa becomes ON.

As a result, the read side bit line BLa is recharged past the voltage of the reference side bit line BLb up close to the $V_{cc}$ level regardless of the read cell data.

Next, the signal Vp is set to the high level and the signal Vn to the low level, the transistors PT12 and NT12 of the sense amplifier S/A are placed in the OFF state, the equalizing signal Ve is set to the high level, and the same is supplied to the gates of the transistors NT3 and NT4 of the equalizing circuit EQL. By this, the CMOS flip-flop of the sense amplifier S/A is equalized, so the amplifier operates as a so-called differential amplifier.

Next, the signals Vta and Vtb are set to the high level and are supplied to the gates of the transistor NT7a of the verification circuit VRFa and the transistor NT7b of the verification circuit VRFb.

As a result, the transistors NT7a and NT7b enter the ON state, a sense operation is performed, and the sensed verification read data is latched in the sense amplifier S/A and used as the rewrite data.

In this way, the data conversion required for verifying each bit is performed.

More specifically, when the write data is "0" and the cell data is "0", the rewrite data is "1", when the write data is "0" and the cell data is "1" the rewrite data is "0", when the write data is "1" and the cell data is "0" the rewrite data is "1" and when the write data is "1" and the cell data is "1", the rewrite data is "1".

However, in the above-mentioned circuit, as shown in FIG. 2, after the word line voltage rises and falls in the interval of the periods t2 to t3 and data is read out, data conversion is performed by raising the activation signal Vav in the interval between the periods t3 and t4, so the sense operation is delayed and time is taken for the verification operation. As a result, there is the problem of unsuitability for a high speed read operation.

SUMMARY OF THE INVENTION

The present invention was made in consideration of the above circumstances and has as its object the provision of a semiconductor nonvolatile memory device which enables shortening of the time of the bit verification operation and thus a high speed read operation.

To achieve the above object, the semiconductor nonvolatile memory device of the present invention is provided with first and second bit lines, a first memory cell array connected to the first bit line, a second memory cell array connected to the second bit line, a latch type sense amplifier having a first and second node for holding complementary levels, a first gate for operatively connecting the first bit line and the first node in accordance with input of a first control signal, a second gate for operatively connecting the second bit line and the second node in accordance with the input of a second control signal, a precharge circuit for precharging the first and second bit lines to a predetermined voltage, an equalizing circuit for equalizing the first and second nodes of the sense amplifier, a plurality of transistors connected in series between the first bit line and a supply source of a voltage lower than the precharge voltage of the precharging circuit, connected at one gate electrode to the second node, and connected at the other gate electrode to an input line of a first activation signal, and a plurality of transistors connected in series between the second bit line and a supply source of a voltage lower than the precharge voltage of the precharging circuit, connected at one gate electrode to the first node, and connected at the other gate electrode to an input line of a second activation signal, wherein, at the time of a verification read operation, the activation signals are input to the gate electrodes of the transistors connected to the bit line at the reference side to render those transistors in conductive state.

Alternatively, the semiconductor nonvolatile memory device of the present invention including first and second bit lines, a first memory cell array connected to the first bit line, a second memory cell array connected to the second bit line, a latch type sense amplifier having a first and second node for holding complementary levels, a first transistor for operatively connecting the first bit line and the first node in accordance with input of a first control signal to a gate electrode, a second transistor for operatively connecting the second bit line and the second node in accordance with the input of a second control signal to a gate electrode, a precharge circuit for precharging the first and second bit lines to a predetermined voltage, and an equalizing circuit for equalizing the first and second nodes of the sense amplifier, wherein, at the time of a verification read operation, the gate electrode of the transistor among the first and second transistors which is connected to the bit line on the reference side is given as input a control signal set to a level not more than a voltage comprised of the precharge voltage of that bit line plus the threshold voltage of that transistor.

Alternatively, the semiconductor nonvolatile memory device of the present invention, including first and second bit lines, a first memory cell array connected to the first bit line, a second memory cell array connected to the second bit line, a latch type sense amplifier having first and second nodes for holding complementary levels, a first transistor for operatively connecting the first bit line and the first node in accordance with input of a first control signal to a gate electrode, a second transistor for operatively connecting the second bit line and the second node in accordance with the input of a second control signal to a gate electrode, a first precharge transistor for operatively connecting a signal line of a precharge voltage and the first bit line in accordance with the input of a first precharge signal to a gate electrode, a second precharge transistor for operatively connecting the signal line of the precharge voltage and the second bit line in accordance with the input of a second precharge signal to a gate electrode, and an equalizing circuit for equalizing the first and second nodes of the sense amplifier, wherein, at the time of a verification read operation, the first and second bit lines are precharged, then control signals are input to the gate electrode of the transistor connected to the bit line and node on the read side so as to make the transistor conductive for a fixed time, then the gate electrode of the precharge transistor connected to the bit line on the read side is given as input a precharge signal set to a level of a voltage comprised of the precharge voltage of that bit line plus a threshold voltage of that transistor.

As explained above, according to the present invention, at the time of a verification operation, assuming for example the first bit line side is made the read side and the second bit line side the reference side, first the first and second bit lines are precharged to predetermined voltages by the precharge circuit.

Next, an activation signal is supplied to the gate of the transistor connected to the second bit line on the reference side. The transistor receiving the activation signal as input becomes a conductive state. As a result, the immediately previous write data is reflected in the second bit line. That is, data is converted.

When the write data is "0", the gate of the transistor connected in series to the transistor in the conductive state is connected to the first node and is supplied with 0 V due to the latched data of the latch type sense amplifier, so the transistor holds the OFF state. Accordingly, the voltage of the second bit line of the reference side does not change.

Next, the sense amplifier is equalized by the equalizing circuit and the immediately previous write data is discarded. Then, the word lines etc. connected to the control gates of the memory cells on the read side and the reference side are placed in the ON state.

After the elapse of a predetermined time, the first and second control signals are supplied to the first and second gates and thus the two gates enter the ON state. As a result, a sense operation is performed and the sensed verification read data is latched to the sense amplifier and used as rewrite data.

When the write data is "0" and the write operation is insufficient, after the verification operation, the potential of the first bit line drops due to the cell current. The read data becomes the low level and is latched in the sense amplifier. At the time of a rewrite operation, the low level latched at the verification read operation is applied to the drain of the memory cell and a rewrite operation is performed. Accordingly, the data latched at the verification read operation is used as the rewrite data as it is.

When the write data is "0" and the write operation is sufficient, after the verification operation, the cell current does not flow, so the voltage of the first bit line is held at the precharge voltage. Accordingly, if a read operation is performed, the high level is detected. At the time of a rewrite operation, the 7 V obtained by level conversion of the high level sensed in the verification operation is applied to the channel of the memory cell and is not written.

Further when the write data is "1", since the gate voltage of the transistor connected to the second bit line is a high level due to the latch data of the latch type sense amplifier, the transistor becomes the ON state and the potential of the second bit line on the reference side falls.

At this time, the potential of the first bit line on the read side falls on the basis of the cell current, but the reference side is almost 0 V, so the read data is detected as the high level. As a result, a "0" write operation does not occur at the time of the rewrite operation and the data latched in the verification read operation is used as it is as the rewrite data.

Further, according to the present invention, at the time of the verification operation, if for example the first bit line side is made the read side and the second bit line side the reference side, first the first and second bit lines are precharged to a predetermined voltage by the precharging circuit.

Next, a second control signal set to a level of not more than the voltage comprised of the precharge voltage of the bit line plus the threshold voltage $V_{th}$ of the second transistor is supplied to the gate of the second transistor connected to the second bit line on the reference side, whereby the immediately previous write data is reflected in the second bit line. That is, data is converted.

When the write data is "0", the inverted data "1" is latched at the reference side of the sense amplifier. At this time, the level of the second control signal is set to a level of not more than the voltage comprised of the precharge voltage plus the threshold voltage $V_{th}$ of the second transistor, whereby the second transistor is held at the OFF state. The voltage of the second bit line on the reference side does not change and is held at the precharge voltage.

Next, the sense amplifier is equalized by the equalizing circuit and the immediately previous write data is discarded. Next, the word lines etc. connected to the control gate of the memory cells on the read side and the reference side are placed in the ON state.

Next, after the elapse of a predetermined time, the first and second control signals are supplied to the first and second transistors, the two transistors become the ON state, a sense operation is performed, and the sensed verification read data is latched to the sense amplifier and used as the rewrite data.

When the write data is "0" and the write operation is insufficient, after the verification operation, the potential of the first bit line falls by the cell current, and the read data becomes the low level and is latched to the sense amplifier. At the time of a rewrite operation, the low level latched in the verification read operation is applied to the drain of the memory cell and written again. Accordingly, the data latched at the verification read operation is used as is as the rewrite data.

When the write data is "0" and the write operation is sufficiently carried out, after the verification operation, no cell current flows, so the voltage of the first bit line is held to the precharge voltage. Accordingly, if a read operation is performed, a high level signal is detected. At the time of a rewrite operation, the 7 V signal obtained by level conversion of the high level signal sensed in the verification operation is applied to the channel of the memory cell and is not written.

Next, when the write data is "1", the inverted data "0" is latched at the second node of the reference side of the sense amplifier. By setting the level of the second control signal to a level of not more than the voltage comprised of the precharge voltage plus the threshold voltage $V_{th}$ of the second transistor, the second transistor becomes the ON state and the voltage of the second bit line on the reference side falls through the latch type sense amplifier.

Next, the first and second control signals are set to the high level ($V_{cc}$ level) through the predetermined equalizing processing etc. and are supplied to the gates of the first and second transistors. As a result, the two transistors enter the ON state and a sense operation is performed.

At this time, the potential of the first bit line in the read side falls by the cell current, but the voltage of the reference side is almost 0 V, so the read data is detected as the high level.

As a result, there is no "0" write operation at the time of the rewrite operation and the data latched at the verification read operation is used as is as the rewrite data.

Further, according to the present invention, at the time of the verification operation, if for example the first bit line side is made the read side and the second bit line side the reference side, then first the first and second precharge signals are supplied to the gates of the first and second precharge transistors at a predetermined level, for example, the high level ($V_{cc}$).

As a result, the first bit line of the read side and the second bit line of the reference side are precharged to the precharge voltage, for example, (½) $V_{cc}$.

When the first and second precharge signals are set to the low level, the precharge transistors become the OFF state, but the first and second bit lines are held at the precharge level ((½)$V_{cc}$).

Next, the first control signal is set for example to the high level and supplied to the first transistor gate, and the immediately previous write data is reflected in the potential of the first bit line on the read side.

Here, when no write operation is performed, the voltage of the first bit line on the read side becomes (precharge voltage (½)$V_{cc}$+α) and the voltage of the second bit line on the reference side is held at the precharge voltage (½)$V_{cc}$.

In this state, the first precharge signal is set to a level of a voltage comprised of the precharge voltage plus the threshold voltage $V_{th}$ of the precharge transistor and is supplied for a fixed time to the gate of the first precharge transistor.

In this case, the level of the first bit line on the read side is held as is at the level of (precharge voltage (½)$V_{cc}$+α).

Next, the first and second nodes of the sense amplifier are equalized by the equalizing circuit to a level of (½)$V_{cc}$, the same as the precharge level, for example, and the immediately previous write data is discarded. Further, the word lines etc. connected to the memory cells on the read side and the reference side are set to a predetermined level.

At this time, the memory cells are not subject to a write operation, so function as depletion transistors and a cell current flows. As a result, the potential of the first bit line on the read side falls. Further, the potential of the second bit line on the reference side also falls.

The speed of the fall of the potential of the first bit line on the read side is about twice the speed of fall of the potential of the second bit line on the reference side, but the first bit line is precharged to a level +α higher than the second bit line, so by adjusting the period during which the level of the word lines is set to the high level, the level of the first bit line is held at a state higher than the level of the second bit line.

Next, after the elapse of a predetermined time, the first and second control signals are supplied to the first and second transistors, the two transistors become the ON state, and the first bit line level is pulled up to the high ($V_{cc}$) level. Further, a sense operation is performed and the sensed verification read data is latched and used as the rewrite data. In this case, the high level is latched.

If the write operation is sufficiently carried out, in the same way as above, after the first and second bit lines are precharged, the first control signal is set to the high level for a fixed period and supplied to the gate of the first transistor, and the immediately previous write data is reflected in the potential of the first bit line on the read side.

In this case the voltage of the first bit line on the read side becomes (precharge voltage $(\frac{1}{2})V_{cc}-\alpha$) and the voltage of the second bit line on the reference side is held at the precharge voltage $(\frac{1}{2})V_{cc}$.

In this state, the first precharge signal is set to the level of the voltage of the precharge voltage plus the threshold voltage of the precharge transistor and is supplied for a fixed time to the gate of the first precharge transistor.

In this case, the first bit line on the read side is charged to a level near the precharge voltage $(\frac{1}{2}) V_{cc}$.

Next, the first and second nodes of the sense amplifier are equalized by the equalizing circuit to the $(\frac{1}{2}) V_{cc}$ level like the precharge level, for example, and the immediately previous write data is discarded. Further, the word lines etc. connected to the read side and reference side memory cells are set to a predetermined level.

At this time, since the memory cells are sufficiently written in state, they function as enhancement transistors and cell current does not flow. As a result, the potential of the first bit line on the read side does not fall. As opposed to this, the potential of the second bit line on the reference side falls.

Next, after the elapse of a predetermined time, the first and second control signals are supplied to the first and second transistors, the two transistors become the ON state, and the level of the first bit line is pulled up to the high ($V_{cc}$) level. Further, since the write operation is sufficient, the sensed verification read data is latched to the high level and used as the rewrite data. In this case, a rewrite operation is not performed. If the write operation is insufficient, first, in the same way as above, after the first and second bit lines are precharged, the first control signal is set to the high level for a fixed period and supplied to the gate of the first transistor, and the immediately previous write data is reflected in the potential of the first bit line on the read side.

In this case the voltage of the first bit line on the read side becomes (precharge voltage $(\frac{1}{2})V_{cc}-\alpha$) and the voltage of the second bit line on the reference side is held at $(\frac{1}{2})V_{cc}$.

In this state, the first precharge signal is set to the level of the voltage of the precharge voltage plus the threshold voltage of the precharge transistor and is supplied for a fixed time to the gate of the first precharge transistor.

In this case, the first bit line on the read side is charged to a level near the precharge voltage $(\frac{1}{2}) V_{cc}$.

Next, the first and second nodes of the sense amplifier are equalized by the equalizing circuit to the $(\frac{1}{2}) V_{cc}$ level like the precharge level, for example, and the immediately previous write data is discarded. Further, the word lines etc. connected to the read side and reference side memory cells are set to a predetermined level.

At this time, since the memory cells are not sufficiently written in state, they function as depletion transistors and cell current flows. As a result, the potential of the first bit line on the read side falls. Further, the potential of the second bit line on the reference side also falls.

Next, after the elapse of a predetermined time, the first and second control signals are supplied to the first and second transistors, the two transistors enter the ON state, and the level of the first bit line is pulled down to the ground level. Further, since the write operation is insufficient, the sensed verification read data is latched to the low level and used as the rewrite data. In this case, a rewrite operation is performed.

BRIEF DESCRIPTION OF THE DRAWINGS

The above objects and features and other objects and features of the present invention will be more apparent from the following description made with reference to the accompanying drawings, in which.

DESCRIPTION OF THE PREFERRED EMBODIMENTS

The present invention will now be explained in further detail by preferred embodiments with reference to the drawings.

Figure 1:
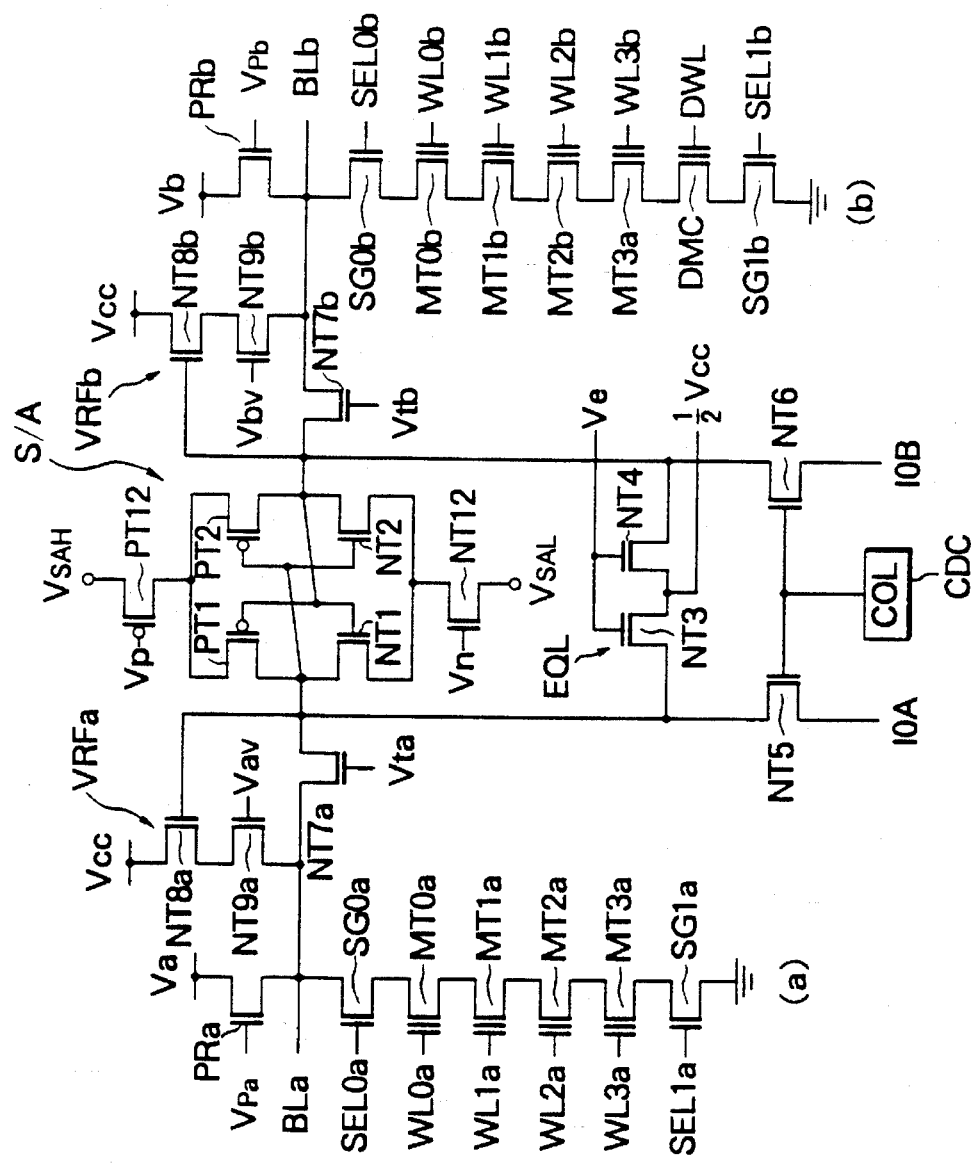
FIG. 1 is a circuit diagram of a conventional NAND type flash memory employing the bit verification system.
Figure 2:
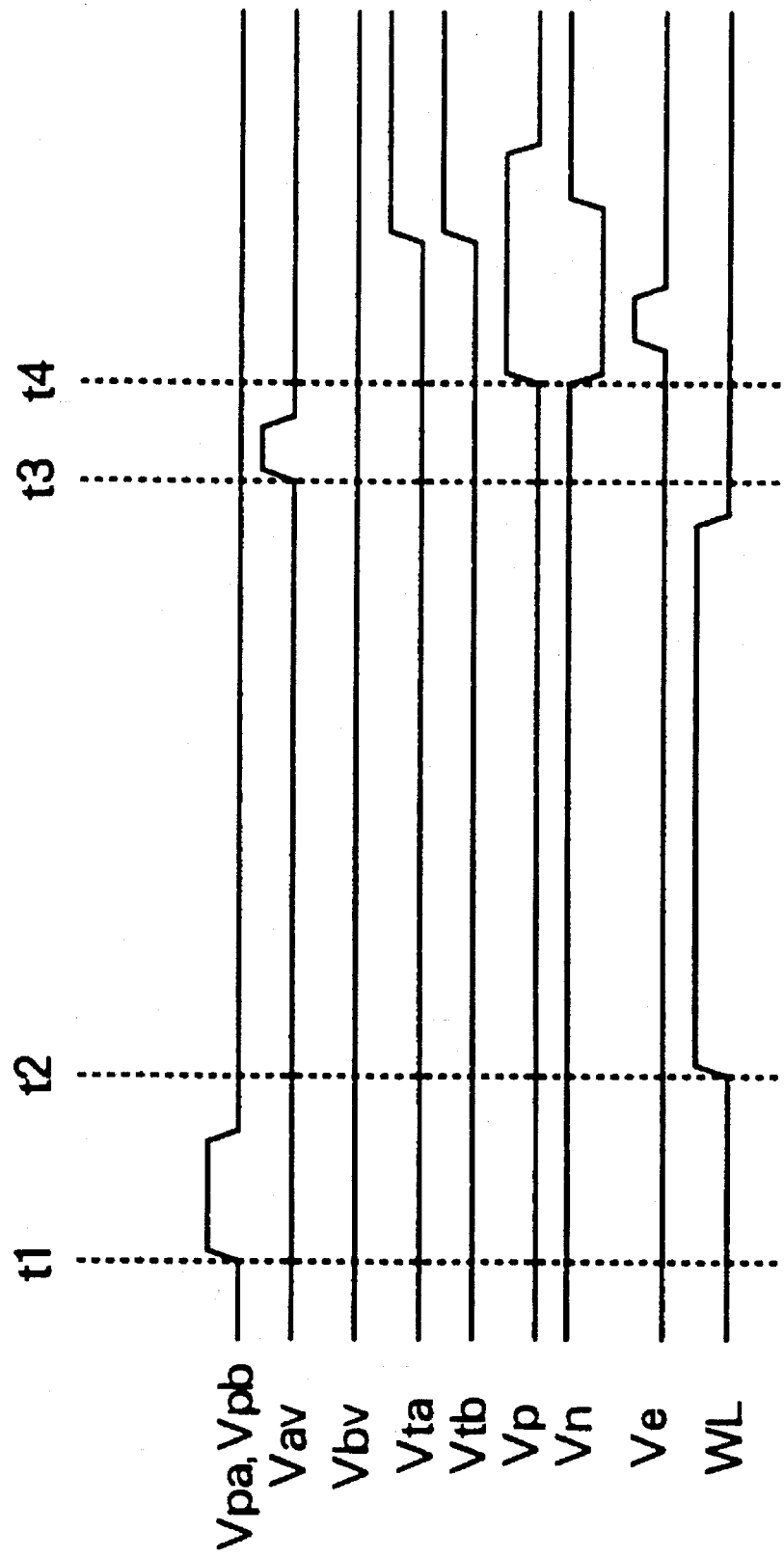
FIG. 2 is a timing chart for explaining the verification operation of the circuit of FIG. 1.
Figure 3:
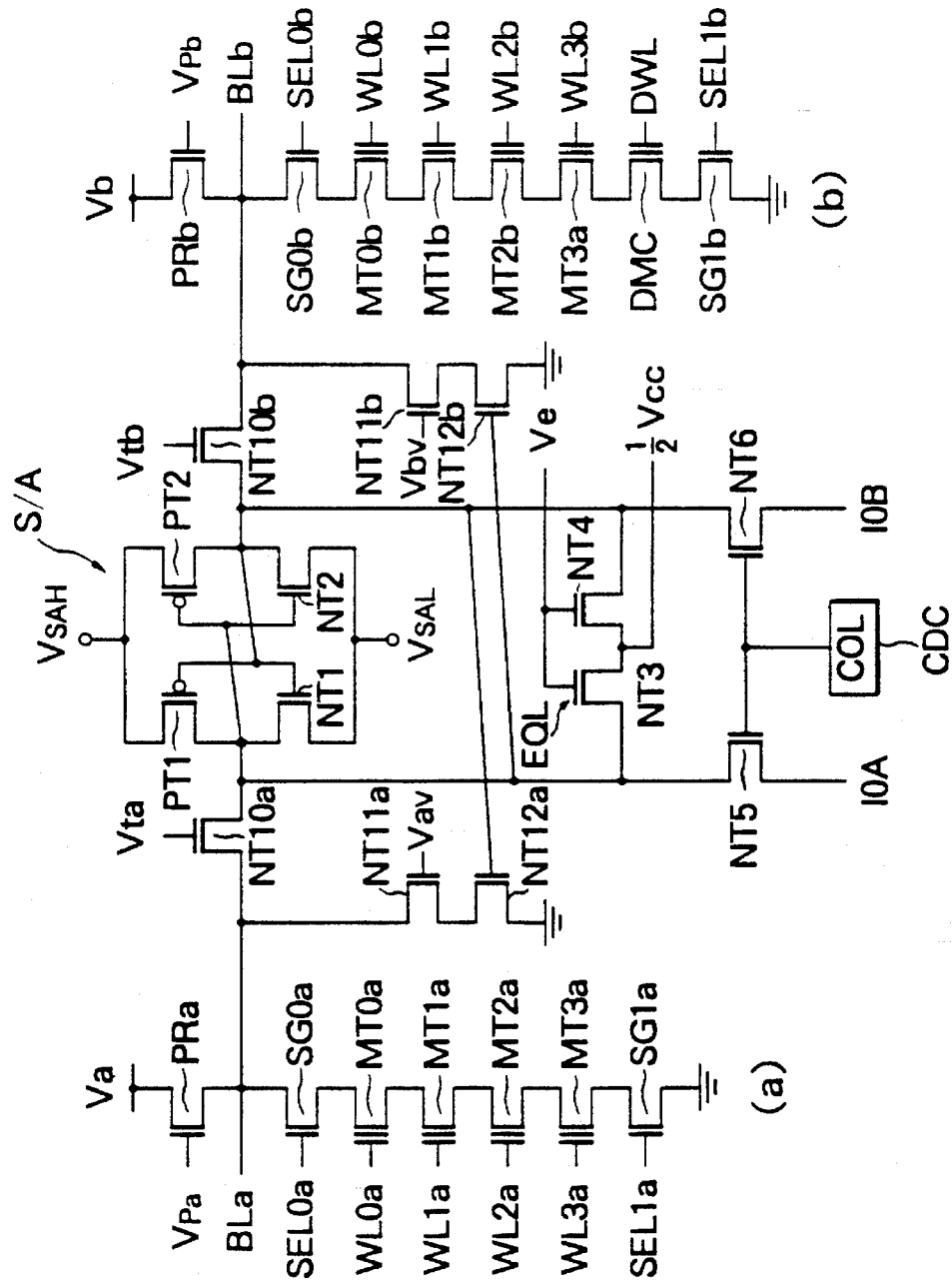
FIG. 3 is a circuit diagram of a first embodiment of a NAND type flash memory employing the bit verification system of the present invention.

FIG. 3 is a circuit diagram of a first embodiment of a NAND type flash memory employing the bit verification system according to the present invention. Constituent elements the same as those in FIG. 1 showing the related art are shown by the same references. An explanation of their connections and functions is omitted.

That is, S/A is a sense amplifier, EQL an equalizing circuit, (a) and (b) cell arrays, CDC a column decoder, BLa and BLb bit lines, SEL0a, SEL1a, SEL0b, SEL1b selection gate lines, WL0a to WL3a, WL0b to WL3b word lines, and NT10b to NT12b NMOS transistors.

The NMOS transistor NT10a connects the point of connection between the drains of the PMOS transistor PT1 and NMOS transistor NT1 of the sense amplifier S/A, that is, the first node, and the bit line BLa. Its gate is connected to the signal line of the signal Vta.

The NMOS transistor 10a functions as a transfer gate in the same way as the NMOS transistor NT7a of the verification circuit VRFa of FIG. 1.

The NMOS transistors NT11a and NT12a are connected in series between the bit line BLa and the ground.

The gate of the NMOS transistor NT11a is connected to the supply line of the signal Vav, while the gate of the NMOS transistor NT12a is connected to the point of connection between the point of connection between the drains of the PMOS transistor PT2 and NMOS transistor NT2 of the sense amplifier S/A, that is, the second node, and the equalizing circuit EQL.

The NMOS transistor NT10b connects the point of connection between the drains of the PMOS transistor PT2 and the NMOS transistor NT2 of the sense amplifier S/A, that is, the second node, and the bit line BLb. Its gate is connected to the signal line of the signal Vtb.

The NMOS transistor NT10b functions as a transfer gate in the same way as the NMOS transistor NT7b of the verification circuit VRFb of FIG. 1.

The NMOS transistors NT11b and NT12b are connected in series between the bit line BLb and the ground.

The gate of the NMOS transistor NT11b is connected to the signal line of the signal Vbv, while the gate of the NMOS transistor NT12b is connected to the point of connection between the point of connection between the drains of the PMOS transistor PT1 and NMOS transistor NT1 of the sense amplifier S/A, that is, the first node, and the equalizing circuit EQL.

Figure 6:
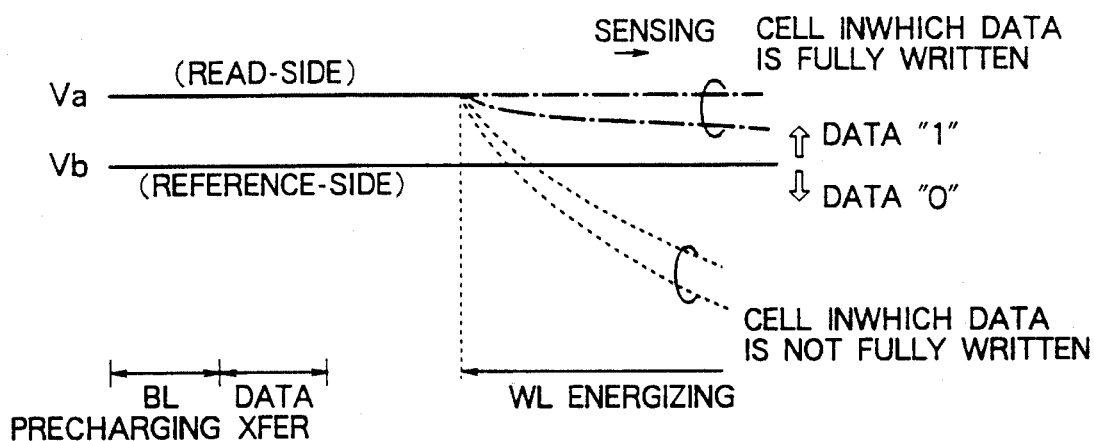
FIG. 6 is a diagram showing the bit line voltage at the time of a verification operation in the case where the immediately previous write data was "0"
Figure 7:
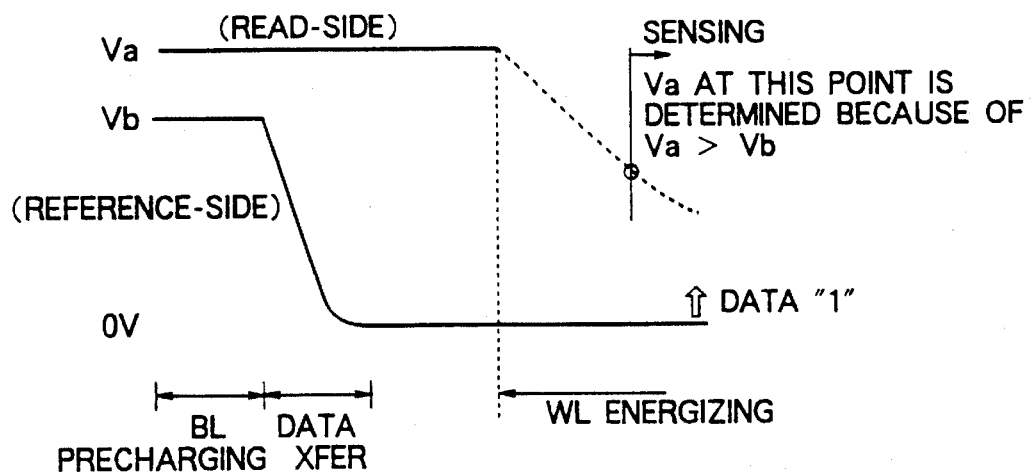
FIG. 7 is a diagram showing the bit line voltage at the time of a verification operation in the case where the immediately previous write data was "1"

Next, the verification operation and reading operation according to the above configuration will be explained using the cell array (a) as the read side and the cell array (b) as the reference side and based on the timing charts of FIG. 4 and FIG. 5 and the status diagrams of the bit line voltages of FIG. 6 and FIG. 7.

Before the verification operation, the immediately previous write data is latched in the latch type sense amplifier S/A. Further, the dummy memory cell DMC of the reference side during a reading operation is in a state erased by ultraviolet light with no cell current flowing.

In this state, first, the precharge signals Vpa and Vpb are set to the high level and supplied to the gates of the precharge transistors PRa and PRb. As a result, the read side bit line BLa is precharged to Va and the reference side bit line BLb is precharged to Vb. In actuality, the read side bit line BLa is precharged to a voltage higher than that of the reference side BLb. That is, the voltages Va and Vb are set so that $V_{cc} > Va > Vb$.

Next, the signal Vbv is set to the high level and supplied to the gate of the NMOS transistor NT11b. As a result, the NMOS transistor NT11b becomes the ON state and the immediately previous write data is reflected in the reference side bit line BLb. That is, the data is converted.

Figure 4:
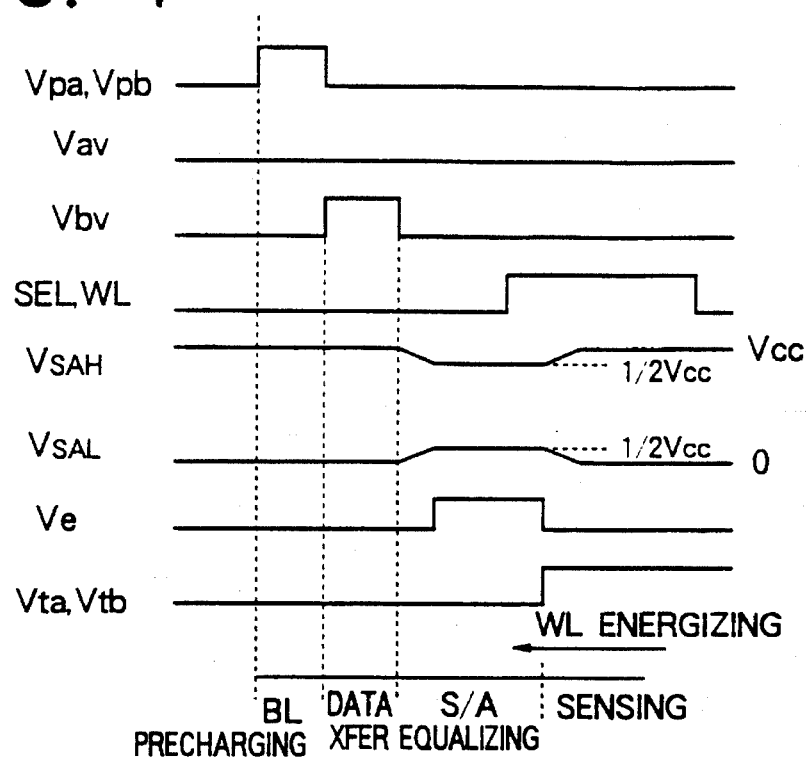
FIG. 4 is a timing chart for explaining the verification operation of the circuit of FIG. 3.

When the write data is "0", the gate voltage of the NMOS transistor NT12b is applied as 0 V due to the latch data of the latch type sense amplifier S/A, so, as shown in FIG. 4, even if the signal Vbv is set to the high level and the NMOS transistor NT11b becomes the ON state, the voltage of the bit line BLb on the reference side does not change.

Next, the equalizing signal Ve is set to the high level and supplied to the transistors NT3 and NT4 of the equalizing circuit EQL. As a result, the two output levels of the CMOS flip-flop of the sense amplifier S/A are equalized to the (½) $V_{cc}$ level and the immediately previous write data is discarded. Further, the word line WL and the selection gate line SEL of the read side and reference side are set to the high level and are placed in the ON state. More specifically, just the word line of the cell desired to be read out is set to 0 V. The others are set to $V_{cc}$ or the booster voltage level.

Next, after the elapse of a predetermined time, the signals Vta and Vtb are set to the high level and supplied to the gates of the NMOS transistors NT10a and NT10b. The voltage $V_{SAH}$ is set to $V_{cc}$ and the voltage $V_{SAL}$ to 0 V.

As a result, the transistor NT10a and NT10b enter the ON state, a sense operation is performed, and the sensed verification read data is latched and used as the rewrite data.

When the write data is "0" and the write operation is insufficient, the potential of the bit line BLa falls due to the cell current after the verification operation, and the read data becomes the low level and is latched at the sense amplifier S/A.

At the time of the rewrite operation, the low level latched at the verification read operation is applied to the drain of the memory cell and a rewrite operation is performed.

Accordingly, the data latched at the verification read operation is used as is as the rewrite data.

When the write data is "0" and the write operation is sufficient, no cell current flows after the verification operation, so the voltage of the bit line BLA is held at the precharge voltage Va. Accordingly, if a read operation is performed, the high level is detected.

At the time of a rewrite operation, the 7 V obtained by level conversion of the high level sensed in the verification operation is applied to the drain of the memory cell and is not written. Further, the memory cell is a cell in which the write operation was sufficiently performed, so there is no problem even without no subsequent writing.

Accordingly, the data latched at the verification read operation is used as is as the rewrite data.

Next, an explanation will be made of the case where the write data is "1".

Figure 5:
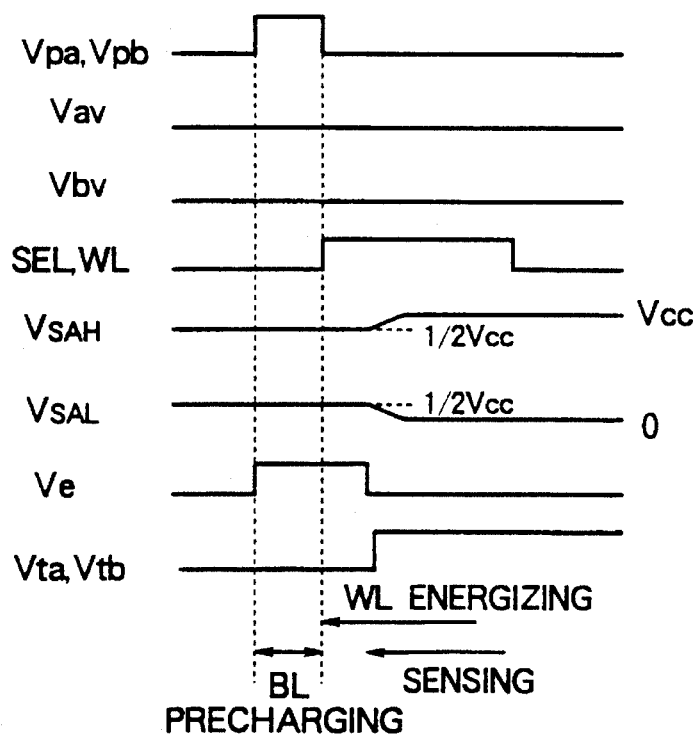
FIG. 5 is a timing chart for explaining the reading operation of the circuit of FIG. 3.

In this case, the gate voltage of the NMOS transistor NT12b is applied with the high level signal due to the latch data of the latch type sense amplifier S/A, so the signal Vbv is set to the high level, the NMOS transistor NT11b becomes the ON state, and, as shown in FIG. 5, the voltage of the bit line BLb on the reference side falls.

At this time, it is preferable to make the time during which the signal Vbv is set to the high level, that is, the time for conversion of data, longer or to make the channel length of the NMOS transistors NT11b and NT12b longer so as to bring the bit line voltage of the reference side down to near 0 V.

Next, the equalizing signal Ve is set to the high level and supplied to the transistors NT3 and NT4 of the equalizing circuit EQL. As a result, the two output levels of the CMOS flip-flop of the sense amplifier S/A are equalized to the (½) $V_{cc}$ level and the immediately previous write data is discarded. Further, the word line WL and the selection gate line SEL of the read side and reference side are set to the high level and are placed in the ON state. More specifically, just the word line of the cell desired to be read out and the word line of the dummy memory cell DMC on the reference side are set to 0 V. The others are set to $V_{cc}$ or the booster voltage level.

Next, after the lapse of a predetermined time, the signals Vta and Vtb are set to the high level and supplied to the gates of the NMOS transistors NT10a and NT10b. The voltage $V_{SAH}$ is set to $V_{cc}$ and the voltage $V_{SAL}$ to 0 V.

As a result, the transistors NT10a and NT10b enter the ON state, a sense operation is performed.

At this time, the potential of the bit line BLa of the read side falls, but the reference side is almost 0 V, so the read data is detected as the high level.

As a result, there is no "0" write operation at the time of the rewrite operation and the data latched at the verification read operation is used as is as the rewrite data.

Note that in the read operation, as shown in FIG. 5, the equalizing operation of the sense amplifier S/A is performed in parallel with the precharging of the bit line. Further, there is no operation for setting the signal Vbv after the precharging to the high level, i.e., operation for converting data. This constitutes the difference from the above-mentioned verification operation.

As explained above, according to this embodiment, the access time is determined by the time from when the word line is turned ON to the sense operation, but at the time of a verification operation, the data is converted before the word line is turned ON, so a verification operation becomes possible at the same timing as the normal read operation and thus the judgement levels of the verification operation and normal read operation can be made equal, the bit verification operation shortened, and a high speed read operation realized.

Note that in this embodiment, an explanation was made using the cell array (a) as the read side and the cell array (b) as the reference side, but an operation the same as the above operation is performed even in the case where the cell array (b) is made the read side and the cell array (a) is made the reference side.

Further, in this embodiment, an explanation was made of the case of provision of the dummy memory cell DMC at just the cell array (b) for simplification of the explanation.

Figure 8:
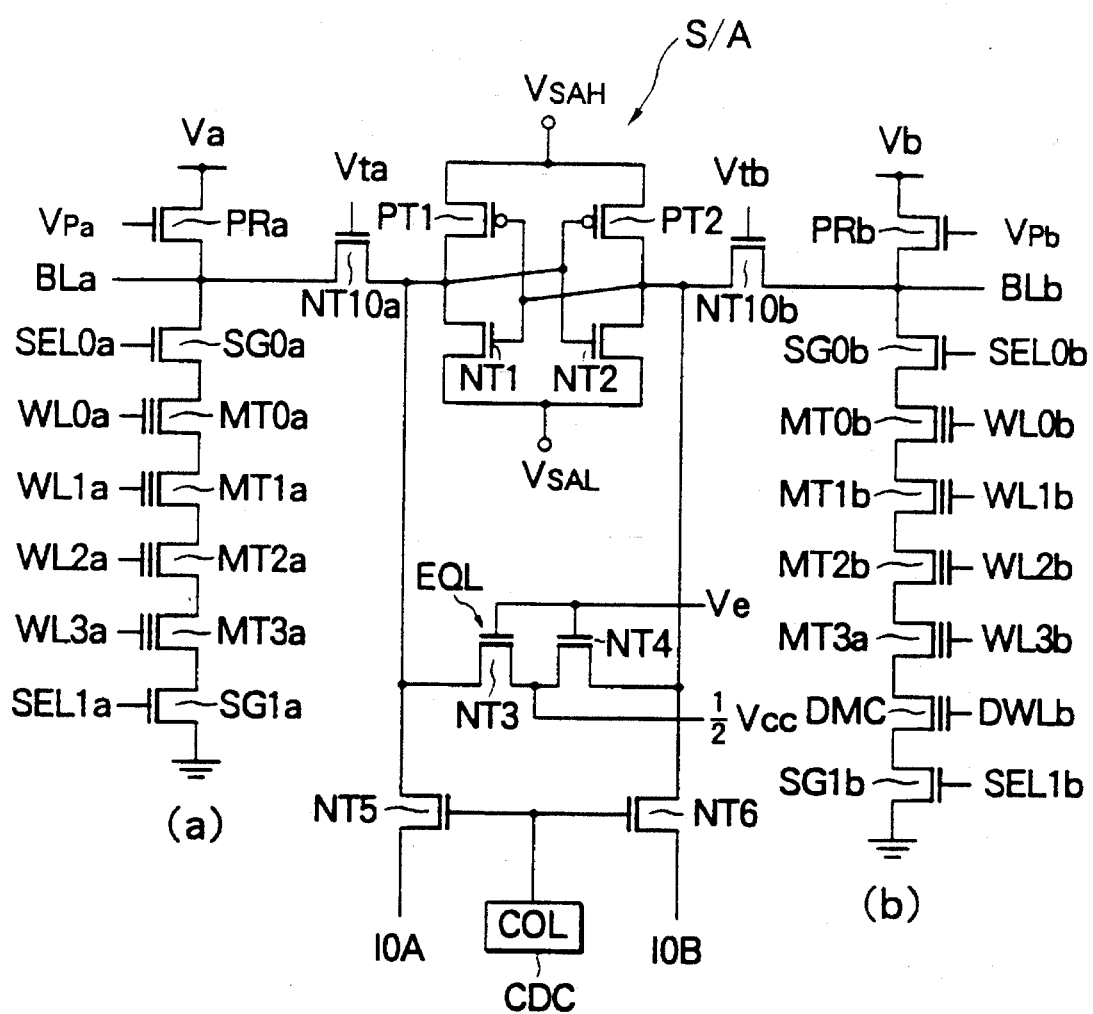
FIG. 8 is a circuit diagram of a second embodiment of a NAND type flash memory employing the bit verification system of the present invention.

FIG. 8 is a circuit diagram of a second embodiment of a NAND type flash memory employing the bit verification system according to the present invention.

The point of difference of this embodiment from the first embodiment lies in the provision of just the NMOS transistors 10a and 10b connecting the bit lines BLa and BLb and sense amplifier S/A and functioning as transfer gates, without provision of the transistors NT11a, 12a, 11b, and 12b serially connected between the two bit lines BLa and BLb, and the control of the voltage supplied to these gates, more specifically, the supply of the signal Vta or Vtb set to the level not more than $(V(a,b)+V_{th}(a,b))$ to the gates of the NMOS transistors connected to the bit line on the reference side, so as to realize data conversion before the word line is turned ON in the same way as in the first embodiment.

Figure 9:
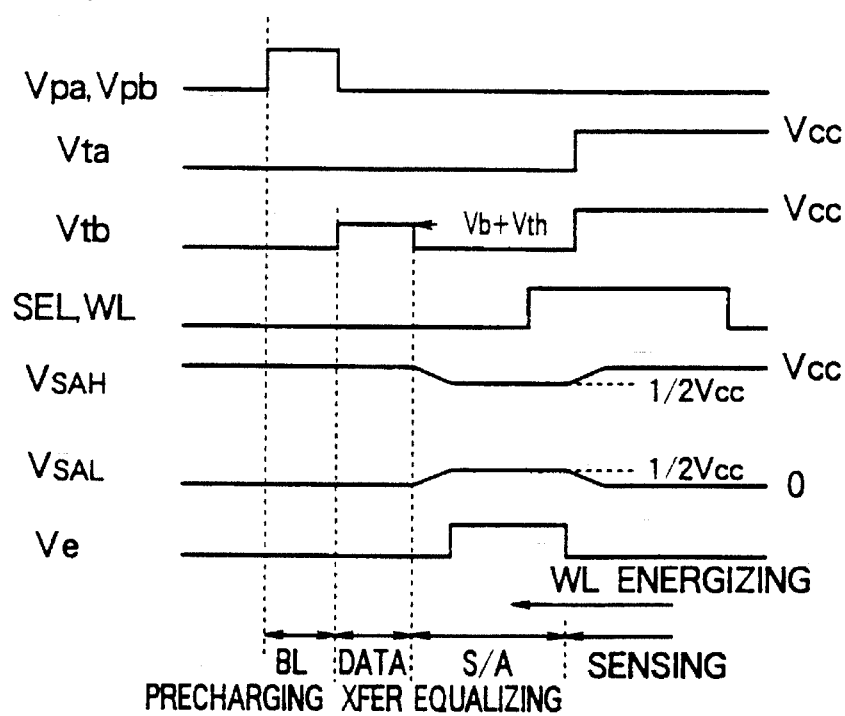
FIG. 9 is a timing chart for explaining the verification operation of the circuit of FIG. 8.

Next, an explanation will be made of the verification operation and read operation according to the above configuration using the cell array (a) as the read side and the cell array (b) as the reference side based on the timing charts of FIG. 9 and FIG. 10.

Before the verification operation, the immediately previous write data is latched in the latch type sense amplifier S/A. Further, the dummy cell DMC on the reference side at the time of the read operation is in a state erased by ultraviolet light in which no cell current flows.

In this state, first, the precharge signals Vpa and Vpb are set to the high level and supplied to the gates of the precharge transistors PRa and PRb. As a result, the read side bit line BLa is precharged to Va and the reference side bit line BLb is precharged to Vb. In actuality, the read side bit line BLa is precharged to a voltage higher than that of the reference side BLb. That is, the voltages Va and Vb are set so that $V_{cc}>Va>Vb$.

Next, the signal Vtb is set to a predetermined level, specifically, a level not more than $(Vb+V_{th}b)$ and supplied to the gate of the NMOS transistor NT10b. The immediately previous write data is reflected in the potential of the reference side bit line BLb. That is, the data is converted. Note that here, $V_{th}b$ shows the threshold voltage of the NMOS transistor NT10b.

When the write data is "0", the inverted data "1" is latched at the reference side of the sense amplifier S/A.

At this time, since the level of the signal Vtb is set to a voltage not more than $(Vb+V_{th}b)$, the NMOS transistor NT10b is held at the OFF state and the voltage of the bit line BLb of the reference side does not change, but is held at Vb.

Next, the equalizing signal Ve is set to the high level and supplied to the gates of the transistors NT3 and NT4 of the equalizing circuit EQL. As a result, the two output levels of the CMOS flip-flop of the sense amplifier S/A are equalized to the (½) $V_{cc}$ level and the immediately previous write data is discarded. Next, the word lines WL and selection gate lines SEL on the read side and reference side are set to the high level and placed in the ON state. More specifically, just the word line of the cell desired to be read out and the word line of the dummy memory cell DMC on the reference side are set to 0 V. The others are set to $V_{cc}$ or the booster voltage level.

Next, after the elapse of a predetermined time, the signals Vta and Vtb are set to the high level ($V_{cc}$ level) and supplied to the gates of the NMOS transistors NT10a and NT10b. The voltage $V_{SAH}$ is set to $V_{cc}$ and the voltage $V_{SAL}$ to 0 V.

As a result, the transistors NT10a and NT10b become the ON state, a sense operation is performed, and the sensed verification read data is latched and used as the rewrite data.

When the write data is "0" and the write operation is insufficient, the potential of the bit line BLa falls by the cell current after the verification operation, and the read data becomes the low level ("0") and is latched at the sense amplifier S/A.

At the time of the rewrite operation, the low level latched at the verification read operation is applied to the drain of the memory cell and a rewrite operation is performed.

Accordingly, the data latched at the verification read operation is used as is as the rewrite data.

When the write data is "0" and the write operation is sufficient, no cell current flows after the verification operation, so the voltage of the bit line BLa is held at the precharge voltage Va. Accordingly, if a read operation is performed, the high level is detected.

At the time of a rewrite operation, the 7 V obtained by level conversion of the high level sensed in the verification operation is applied to the drain of the memory cell and is not written. Further, the memory cell is a cell in which the write operation was sufficiently performed, so there is no problem even without no subsequent writing.

Accordingly, the data latched at the verification read operation is used as is as the rewrite data.

Next, an explanation will be made of the case where the write data is "1".

In this case, the inverted data "0" is latched at the reference side of the sense amplifier S/A.

At this time, the level of the signal Vtb is set to a voltage not more than $(Vb+V_{th}b)$, so the NMOS transistor NT10$b$ enters the ON state. Since the NMOS transistor NT2 of the sense amplifier S/A is in the ON state, the voltage of the reference side bit line BLb falls.

At this time, it is preferable to make the time during which the signal Vtb is set to no more than a predetermined level, that is, the time for conversion of data, longer or to make the channel length of the NMOS transistors NT10$b$ longer so as to bring the bit line voltage of the reference side down to near 0 V.

Next, the equalizing signal Ve is set to the high level and supplied to the transistors NT3 and NT4 of the equalizing circuit EQL. As a result, the two output levels of the CMOS flip-flop of the sense amplifier S/A are equalized to the (½) $V_{cc}$ level and the immediately previous write data is discarded. Further, the word line WL and the selection gate line SEL of the read side and reference side are set to the high level and are placed in the ON state. More specifically, just the word line of the cell desired to be read out and the word line of the dummy memory cell DMC on the reference side are set to 0 V. The others are set to $V_{cc}$ or the booster voltage level.

Next, after the elapse of a predetermined time, the signals Vta and Vtb are set to the high level and supplied to the gates of the NMOS transistors NT10$a$ and NT10$b$. The voltage $V_{SAH}$ is set to $V_{cc}$ and the voltage $V_{SAL}$ to 0 V. As a result, the transistors NT10$a$ and NT10$b$ become the ON state, and a sense operation is performed.

At this time, the potential of the bit line BLa of the read side falls due to the cell current, but the reference side is almost 0 V, so the read data is detected as the high level. As a result, there is no "0" write operation at the time of the rewrite operation and the data latched at the verification read operation is used as is as the rewrite data.

Figure 10:
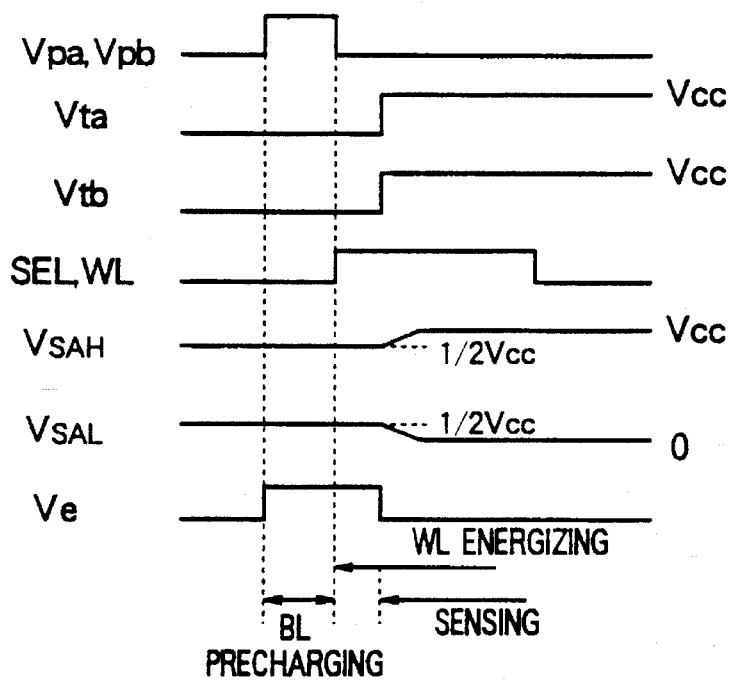
FIG. 10 is a timing chart for explaining the reading operation of the circuit of FIG. 8.

Note that in the read operation, as shown in FIG. 10, the equalizing operation of the sense amplifier S/A is performed in parallel with the precharging of the bit line. Further, there is no operation for setting the signal Vtb after the precharging to not more than the level $(Vb+V_{th}b)$, i.e., operation for converting data. This constitutes the difference from the above-mentioned verification operation.

As explained above, according to this embodiment, in the same way as the first embodiment, the access time is determined by the time from when the word line is turned ON to the sense operation, but at the time of a verification operation, the data is converted before the word line is turned ON, so a verification operation becomes possible at the same timing as the normal read operation and thus the judgement levels of the verification operation and normal read operation can be made equal, the bit verification operation shortened, and a high speed read operation realized.

Further, the transistors for conversion of data are not required, so the circuit configuration may be simplified and the circuit area shortened.

Note that in this embodiment as well, an explanation was made using the cell array (a) as the read side and the cell array (b) as the reference side, but an operation the same as the above operation is performed even in the case where the cell array (b) is made the read side and the cell array (a) is made the reference side.

Further, in this embodiment, an explanation was made of the case of provision of the dummy memory cell DMC at just the cell array (b) for simplification of the explanation.

The circuit configuration of the third embodiment of the invention is similar to that of the second embodiment explained with reference to FIG. 8.

The point of difference from the second embodiment is that instead of the gates of the NMOS transistors connected to the bit lines on the reference side being supplied with the signal Vta or Vtb set to a level not more than $(V(a,b)+V_{th}(a,b))$, the bit lines BLa and BLb are equalized and precharged, then the NMOS transistor NT10 (a or b) connected to the bit lines on the read side is placed in the ON state, then after being placed in the ON state the gate of the NMOS transistor PR (a or b) for precharging the bit lines on the reading line is supplied with a voltage comprised of the precharge voltage ((½)$V_{cc}$) plus the threshold voltage $V_{th}$ of the NMOS transistor PR (a or b), thereby realizing data conversion before the word line is turn ON in the same way as in the first embodiment.

Note that the precharge voltages Va and Vb of the bit lines BLa and BLb in this embodiment are both set to (½)$V_{cc}$.

Figure 11:
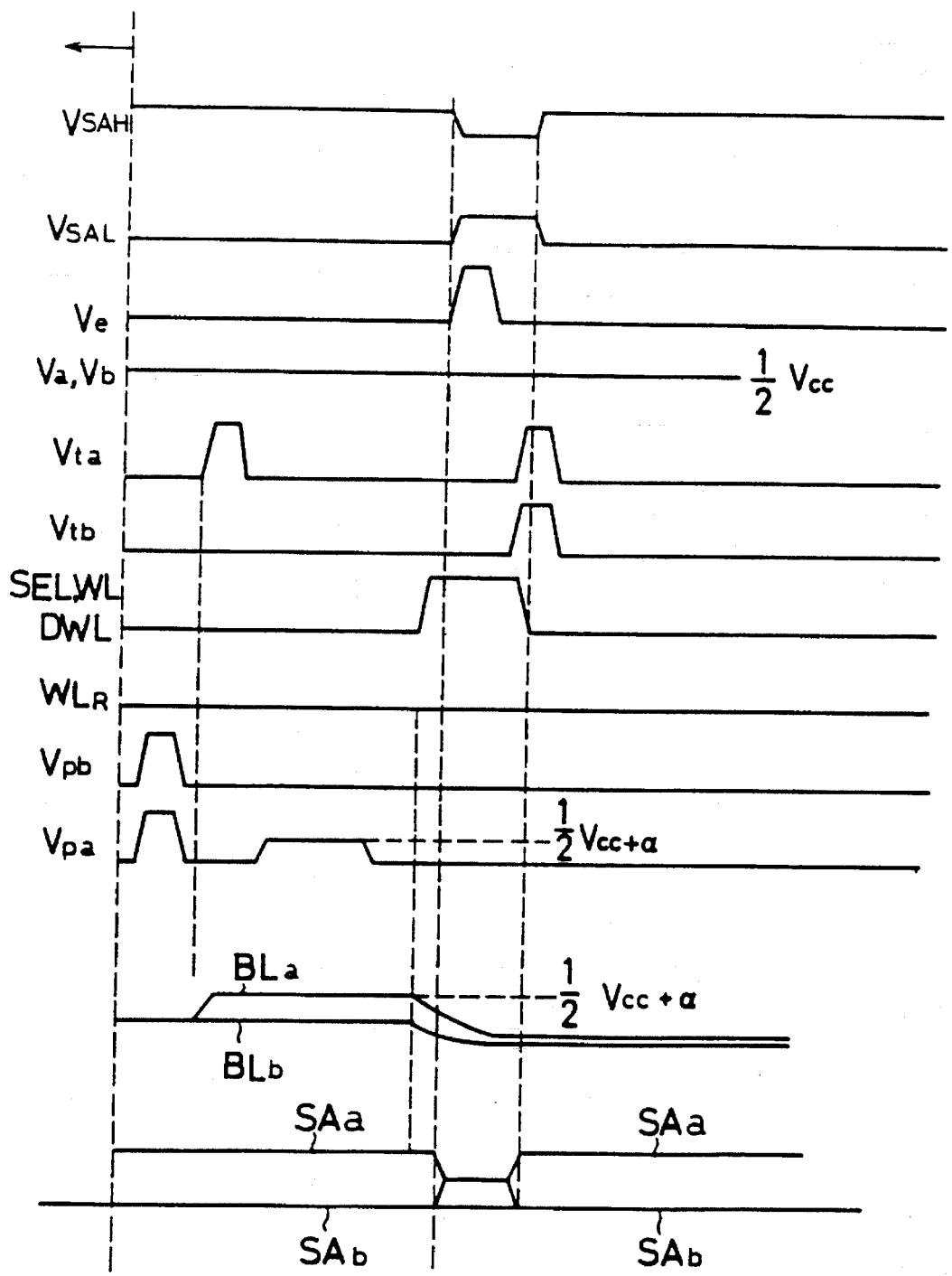
FIG. 11 is a timing chart for explaining another verification operation in the case where no write operation is performed in the circuit of FIG. 8.

Next, the verification operation according to the above configuration will be explained using the cell array (a) and the read side and the cell array (b) as the reference side and based on the timing charts of FIG. 11 to FIG. 13. FIG. 11 shows the case where no write operation is performed, FIG. 12 the case where the write operation is insufficient, and FIG. 13 the case where the write operation is insufficient.

Before the verification operation, the immediately previous write data is latched in the latch type sense amplifier S/A. Further, the dummy memory cell DMC of the reference side during a reading operation is in a state erased by ultraviolet light with no cell current flowing.

In this state, first, the precharge signals Vpa and Vpb are set to the high level, that is, the $V_{cc}$ level, and supplied to the gates of the precharge transistors PRa and PRb for a fixed period. As a result, the bit line BLa of the read side and the bit line Bnb of the reference side are precharged to (½)$V_{cc}$.

Next, when the precharge signals Vpa and Vpb are set to the low level, the precharge transistors PRa and PRb become the OFF state, but the bit line BLa on the read side and the bit line BLb on the reference side are held at the (½)$V_{cc}$ level.

Next, the signal Vta is set to the high level and supplied to the gate of the NMOS transistor NT10$a$, and the immediately previous write data is reflected in the potential of the bit line BLa on the read side.

Here, when no write operation is performed, as shown in FIG. 11, the voltage of the bit line Bna on the read side becomes $((½)V_{cc}+\alpha)$ and the voltage of the bit line Bnb on the reference side is held at (½)$V_{cc}$.

In this state, the precharge signal Vpa is set to $((½)V_{cc}+V_{th}n)$ and is supplied for a fixed time to the gate of the precharge transistor PRa.

In this case, the bit line BLa on the read side is held as is at the level of $((½)V_{cc}+\alpha)$.

Next, the equalizing signal Ve is set to the high level and supplied to the gates of the transistors NT3 and NT4 of the equalizing circuit EQL. As a result, the two output levels of the CMOS flip-flop of the sense amplifier S/A are equalized to the (½)$V_{cc}$ level and the immediately previous write data is discarded. Further, the word lines WL and the selection gate lines SEL on the read side and the reference side are set to the high level and placed in the ON state. Specifically, the word line desired to be read out is set to the 0 V, the word lines WL on the reference side are set to a predetermined level so as to pass a current of about ½ of the cell in the erased state, and the others are set to $V_{cc}$ or the booster voltage level.

At this time, the memory cells are not subject to a write operation, so function as depletion transistors and a cell current flows. As a result, as shown in FIG. 11, the potential of the bit line BLa on the read side falls. Further, the potential of the bit line BLb on the reference side also falls.

The speed of the fall of the potential of the bit line BLa on the read side is about twice the speed of fall of the potential of the bit line BLb on the reference side, but the bit line BLa is precharged to a level +α higher than the bit line BLb, so by adjusting the period during which the level of the word lines is set to the high level, the level of the bit line BLa is held at a state higher than the level of the bit line BLb.

Next, after the elapse of a predetermined time, the signals Vta and Vtb are set to the high level ($V_{cc}$ level) and supplied to the gates of the NMOS transistors NT10a and NT10b. The voltage $V_{SAH}$ is set to $V_{cc}$ and the voltage to 0 V. As a result, the transistors NT10a and NT10b become the ON state and the level of the bit line BLa is pulled up to the $V_{cc}$ level. Further, a sense operation is performed. The sensed verification read data is latched and used as the rewrite data. In this case, the high level is latched.

Next, an explanation will be made of the operation in the case where the write operation is sufficient, referring to FIG. 12.

In the same way as above, after the bit lines BLa and BLb are precharged, the signal Vta is set to the high level and supplied to the gate of the NMOS transistor NT10a. The immediately previous write data is reflected in the potential of the bit line BLa on the read side.

Figure 12:
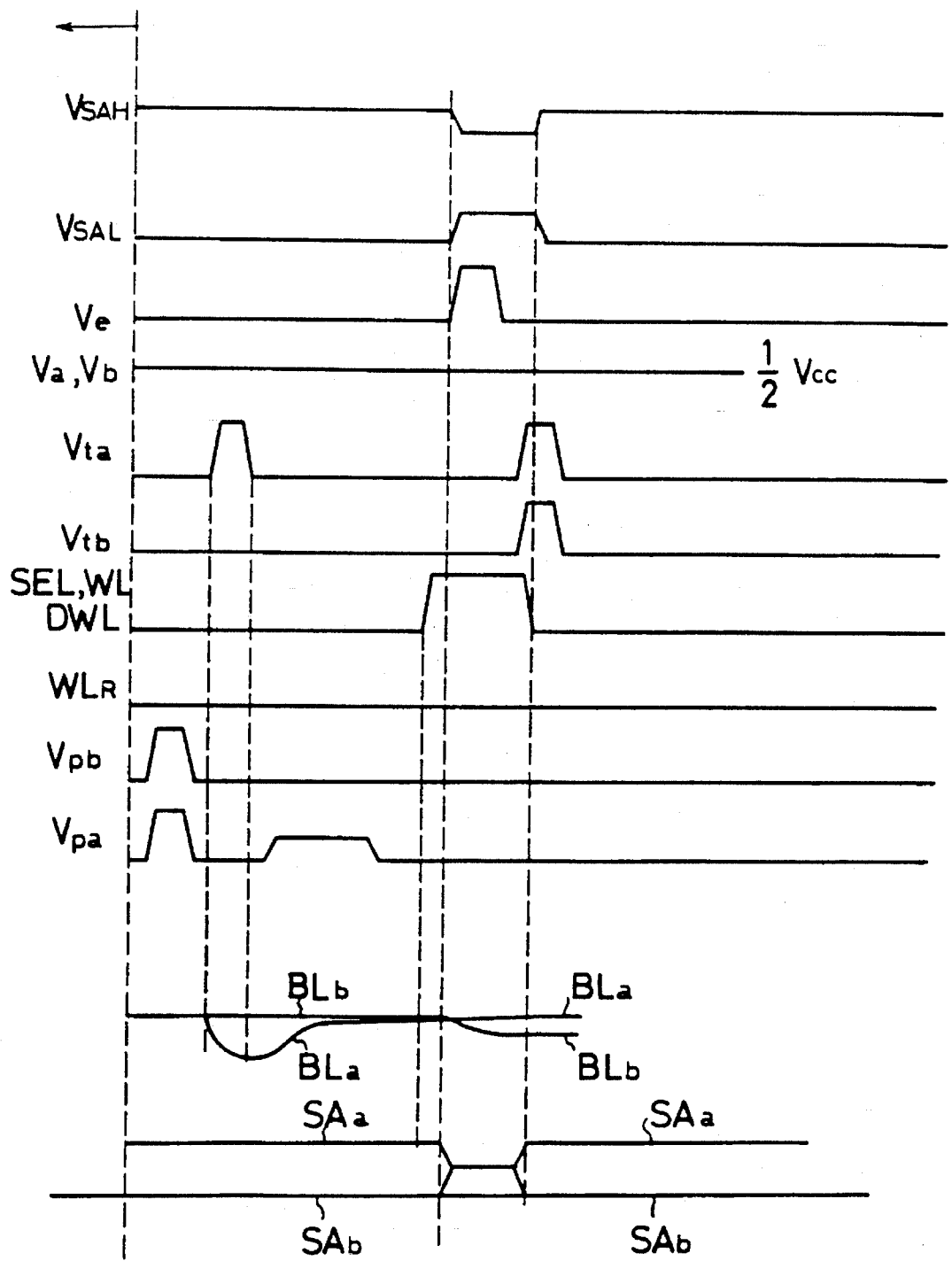
FIG. 12 is a timing chart for explaining another verification operation in the case where the write operation is sufficiently performed in the circuit of FIG. 8.

In this case, like with the case of FIG. 12, the voltage of the bit line BLa on the read side becomes ((½) $V_{cc}$−α) and the voltage of the bit line BLb on the reference side is held at (½) $V_{cc}$.

In this state, the first precharge signal Vpa is set to ((½)$V_{cc}$+$V_{th}$n) and is supplied for a fixed time to the gate of the precharge transistor PRa.

In this case, the bit line BLa on the read side is charged to a level near (½) $V_{cc}$.

Next, the equalizing signal Ve is set to the high level and supplied to the transistors NT3 and NT4 of the equalizing circuit EQL. As a result, the two output levels of the CMOS flip-flop of the sense amplifier S/A are equalized to the (½) $V_{cc}$ level and the immediately previous write data is discarded. Further, the word line WL and the selection gate line SEL of the read side and reference side are set to the high level and are placed in the ON state. More specifically, just the word line WL of the cell desired to be read out is set to 0 V and the word lines WL of the reference side are set to a predetermined voltage so as to pass a current of about ½ the cell in the erased state. The others are set to $V_{cc}$ or the booster voltage level.

At this time, since the memory cell is in a sufficiently written state, it functions as an enhancement transistor and no cell current flows. As a result, as shown in FIG. 12, the potential of the bit line BLa on the read side falls.

As opposed to this, the potential of the bit line BLb on the reference side falls.

Next, after the elapse of a predetermined time, the signals Vta and Vtb are set to the high level ($V_{cc}$ level) and supplied to the gates of the NMOS transistors NT10a and NT10b. The voltage $V_{SAH}$ is set to the voltage $V_{cc}$ and the voltage $V_{SAL}$ to 0 V.

In this case, the bit lines BLa and BLb are precharged to about the same levels, so the bit line BLa is pulled up to the voltage $V_{cc}$ level. Further, since the write operation is sufficient, the sensed verification read data is latched at the high level and used as rewrite data. In this case, a rewrite operation is not performed.

Next, an explanation will be made of the operation in the case where the write operation is insufficient, referring to FIG. 13.

In the same way as above, after the bit lines BLa and BLb are precharged, the signal Vta is set to the high level and supplied to the gate of the NMOS transistor NT10a. The immediately previous write data is reflected in the potential of the bit line BLa on the read side.

Figure 13:
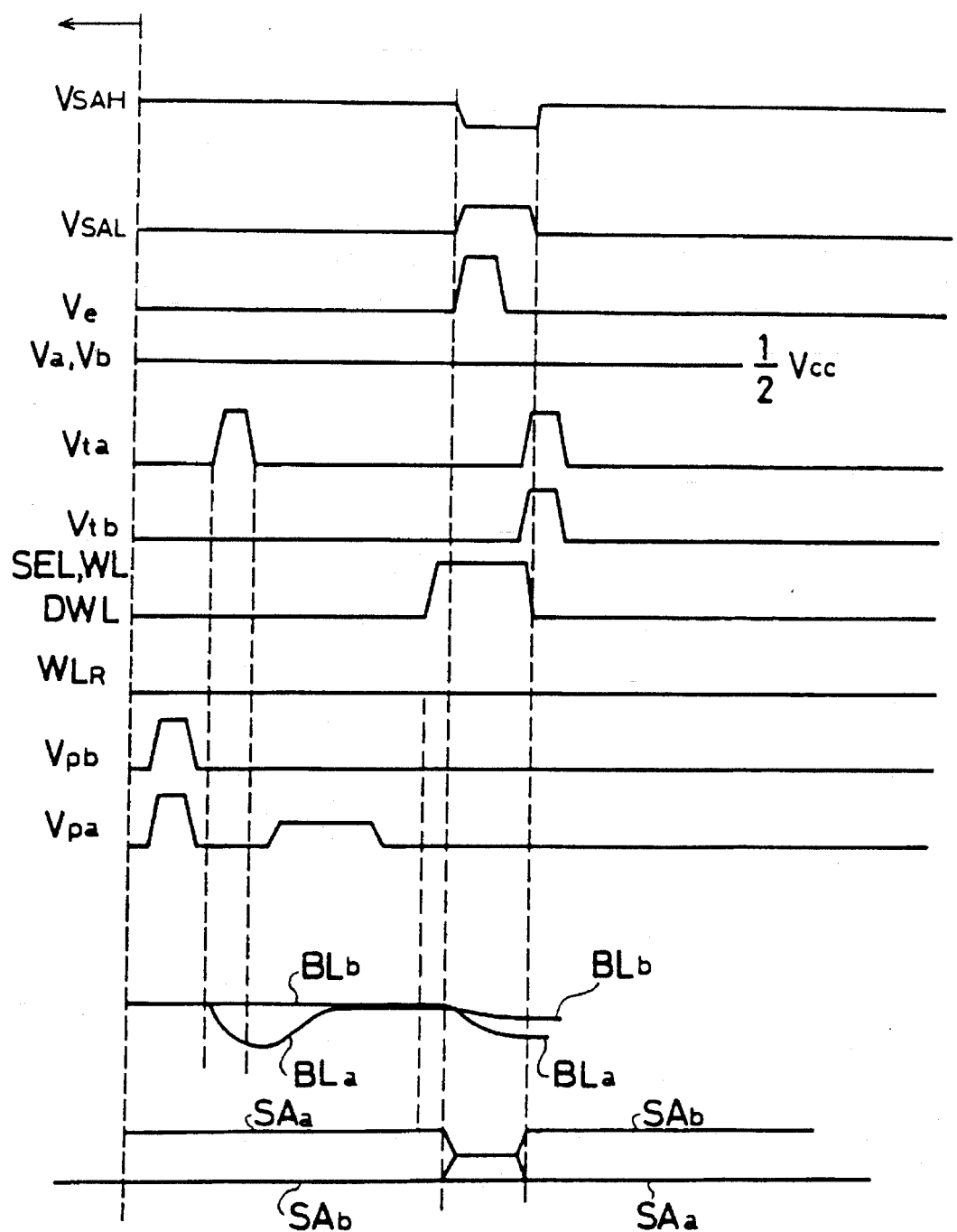
FIG. 13 is a timing chart for explaining another verification operation in the case where the write operation is insufficient in the circuit of FIG. 8.

In this case too, like with the case of FIG. 12, as shown in FIG. 13, the voltage of the bit line BLa on the read side becomes ((½)$V_{cc}$−α) and the voltage of the bit line BLb on the reference side is held at (½)$V_{cc}$.

In this state, the first precharge signal Vpa is set to ((½)$V_{cc}$+$V_{th}$n) and is supplied for a fixed time to the gate of the precharge transistor PRa.

In this case too, the bit line BLa on the read side is charged to a level near (½) $V_{cc}$.

Next, the equalizing signal Ve is set to the high level and supplied to the transistors NT3 and NT4 of the equalizing circuit EQL. As a result, the two output levels of the CMOS flip-flop of the sense amplifier S/A are equalized to the (½) $V_{cc}$ level and the immediately previous write data is discarded. Further, the word line WL and the selection gate line SEL of the read side and reference side are set to the high level and are placed in the ON state. More specifically, just the word line of the cell desired to be read out is set to 0 V. The others are set to $V_{cc}$ or the booster voltage level.

At this time, since the memory cell is not in a sufficiently written state, it functions as a depletion transistor and a cell current flows. As a result, as shown in FIG. 13, the potential of the bit line BLa on the read side falls. Further, the potential of the bit line BLb on the reference side falls.

Next, after the elapse of a predetermined time, the signals Vta and Vtb are set to the high level ($V_{cc}$ level) and supplied to the gates of the NMOS transistors NT10a and NT10b. The voltage $V_{SAH}$ is set to the voltage $V_{cc}$ and the voltage $V_{SAL}$ to 0 V.

In this case, the bit lines BLa and BLb are precharged to about the same levels, so the bit line BLa is pulled down to the ground level. Further, since the write operation is insufficient, the sensed verification read data is latched at the low level and used as rewrite data. In this case, a rewrite operation is performed.

Figure 14:
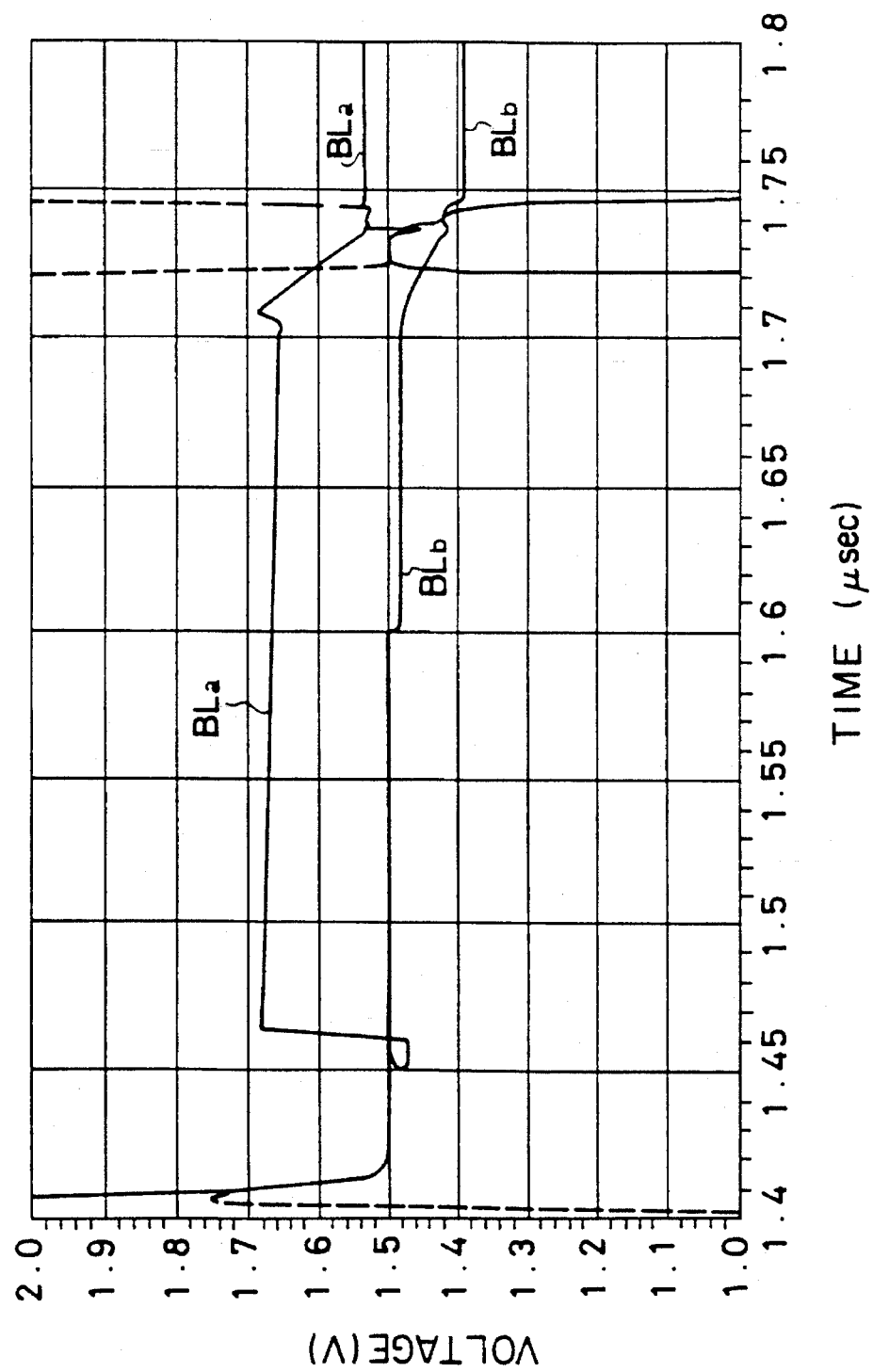
FIG. 14 is a diagram of the results of simulation of another verification operation in the case where no write operation is performed in the circuit of FIG. 8.
Figure 15:
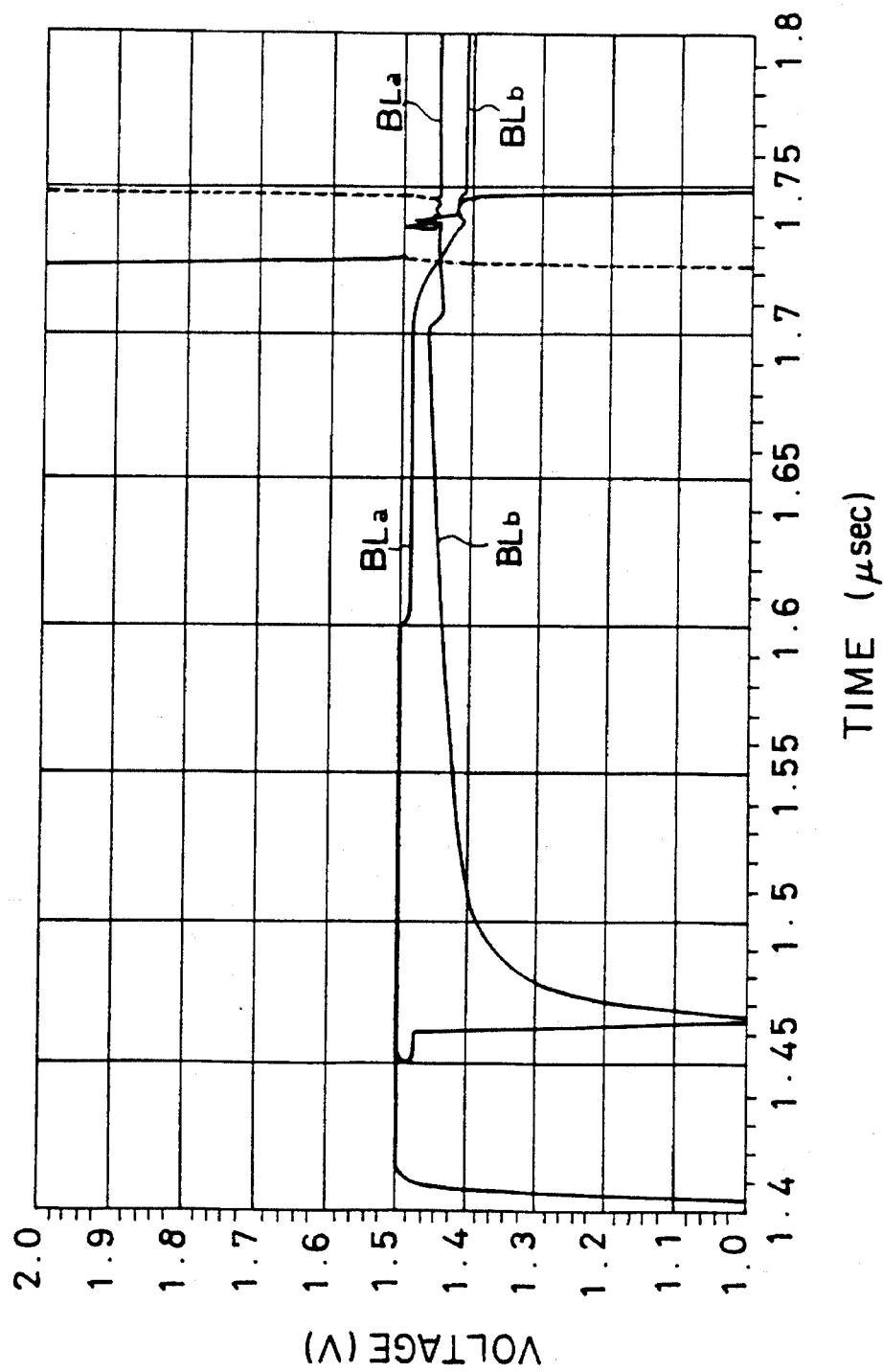
FIG. 15 is a diagram of the results of simulation of another verification operation in the case where the write operation is sufficiently performed in the circuit of FIG. 8.
Figure 16:
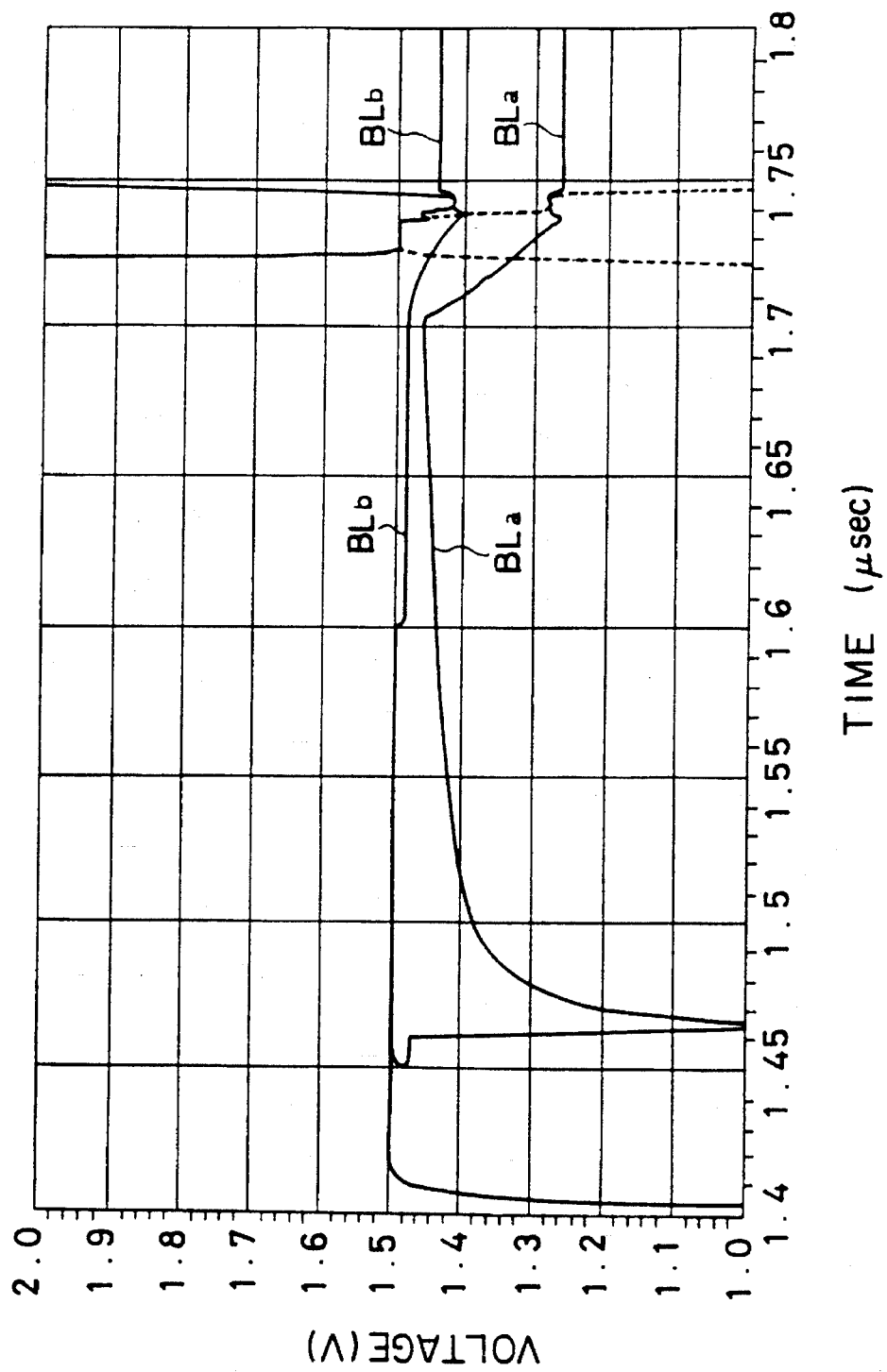
FIG. 16 is a diagram of the results of simulation of another verification operation in the case where the write operation is insufficiently performed in the circuit of FIG. 8.

Note that FIG. 14 to FIG. 16 are diagrams of the results of simulations performed in accordance with this data conversion system. In FIG. 14 to FIG. 16, the horizontal axes show the time and the vertical axes the voltage.

FIG. 14 shows the results of a simulation of the verification operation in the case where no write operation is performed and corresponds to FIG. 11. Similarly, FIG. 15 shows the results of a simulation of the verification operation in the case were a write operation is sufficiently performed and corresponds to FIG. 12, while FIG. 16 shows the results of a simulation of the verification operation in the case where a write operation is insufficiently performed and corresponds to FIG. 13.

In this way, similar results are obtained as in FIG. 11 to FIG. 13 even in a simulation.

As explained above, according to this embodiment, like with the first and second embodiments, the data is converted before the word lines are turn ON in the verification operation, so it is possible to verify the bits at the same timing as the usual read operation and therefore the judgement levels of the verification operation and usual reading operation may be made equal, the bit verification operation shortened, and high speed read operation realized.

Further, the transistors for conversion of data are not required, so the circuit configuration may be simplified and the circuit area shortened.

Note that in this embodiment as well, an explanation was made using the cell array (a) as the read side and the cell array (b) as the reference side, but an operation the same as the above operation is performed even in the case where the cell array (b) is made the read side and the cell array (a) is made the reference side.

As explained above, according to the present invention, it is possible to shorten the bit verification operation and therefore enable high speed reading.

Further, since, at the time of the verification read operation, the gate electrode of the transistor among the first and second transistors which is connected to the bit line on the reference side is given as input a control signal set to a level not more than a voltage comprised of the precharge voltage of that bit line plus the threshold voltage of that transistor or the bit lines are precharged, then the transistor connected to the bit line and node on the read side is placed in the ON state for a fixed period, then the gate of the transistor for precharging the bit line on the read side is supplied with a voltage comprised of the precharge voltage plus a threshold voltage of that transistor, data conversion transistors become unnecessary and therefore the circuit configuration can be simplified and the circuit area reduced.

What is claimed is:

1. A semiconductor nonvolatile memory device, comprising:

first and second bit lines;

a first memory cell array connected to said first bit line;

a second memory cell array connected to said second bit line;

a latch type sense amplifier having a first and second node for holding complementary levels;

a first gate for operatively connecting said first bit line and said first node in accordance with input of a first control signal;

a second gate for operatively connecting said second bit line and the second node in accordance with the input of a second control signal;

a precharge circuit for precharging said first and second bit lines to a predetermined voltage;

an equalizing circuit for equalizing said first and second nodes of said sense amplifier;

a plurality of transistors connected in series between said first bit line and a supply source of a voltage lower than said precharge voltage of said precharge circuit, connected at one gate electrode to said second node, and connected at the other gate electrode to an input line of a first activation signal; and a plurality of transistors connected in series between said second bit line and a supply source of a voltage lower than said precharge voltage of said precharge circuit, connected at one gate electrode to said first node, and connected at the other gate electrode to an input line of a second activation signal, wherein, at the time of a verification read operation, said activation signals are input to said gate electrodes of said transistors connected to said bit line at a reference side to make those transistors conductive.

2. A semiconductor nonvolatile memory device as set forth in claim 1, further comprising a NAND circuit.

* * * * *